(12) United States Patent
Burgess, Jr. et al.

(10) Patent No.: US 6,690,607 B2
(45) Date of Patent: Feb. 10, 2004

(54) METHOD AND APPARATUS FOR LOW POWER MEMORY

(75) Inventors: Richard J. Burgess, Jr., Cherry Valley, MA (US); Lawrence T. Clark, Phoenix, AR (US); Kimberley E. Wagner, Chandler, AR (US); Mark A. Schaecher, Phoenix, AR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/368,969

(22) Filed: Feb. 18, 2003

(65) Prior Publication Data

US 2003/0174541 A1 Sep. 18, 2003

Related U.S. Application Data

(63) Continuation of application No. 09/587,495, filed on Jun. 2, 2000, now Pat. No. 6,608,779.

(51) Int. Cl.⁷ ................................................. G11C 7/00
(52) U.S. Cl. .................. 365/207; 365/189.07; 365/208; 365/210
(58) Field of Search ............................ 365/207, 189.07, 365/210, 208

(56) References Cited

U.S. PATENT DOCUMENTS

| | | | |
|---|---|---|---|
| 5,153,535 A | 10/1992 | Fairbanks et al. | |
| 5,214,654 A | 5/1993 | Oosawa | |
| 5,528,544 A | * 6/1996 | Kohno | ........................ 365/207 |
| 5,627,412 A | 5/1997 | Beard | |
| 5,729,492 A | * 3/1998 | Campardo | ............. 365/185.21 |
| 5,812,860 A | 9/1998 | Horden et al. | |
| 6,054,918 A | 4/2000 | Holst | |
| 6,144,590 A | 11/2000 | Markert et al. | |
| 6,219,290 B1 | * 4/2001 | Chang et al. | ................ 365/207 |

OTHER PUBLICATIONS

"Low Power Cache Opepation Through the Use of Partial Tag Comparison", application No: 09/362,919, Filed: Jul. 27, 1999, Inventors: Burgess, Jr., et al. 29 Pgs.

"Method and Apparatus Providing Multiple Voltages and Frequencies Selectable Based on Real Time Criteria to Control Power Consumption", application No. 09/668,952, Filed: Sep. 22, 2000, Inventors: Horden, et al.

* cited by examiner

*Primary Examiner*—Son T. Dinh
(74) *Attorney, Agent, or Firm*—John F. Travis

(57) ABSTRACT

Embodiments of the invention are disclosed that include a low power memory and a low power data path.

4 Claims, 6 Drawing Sheets

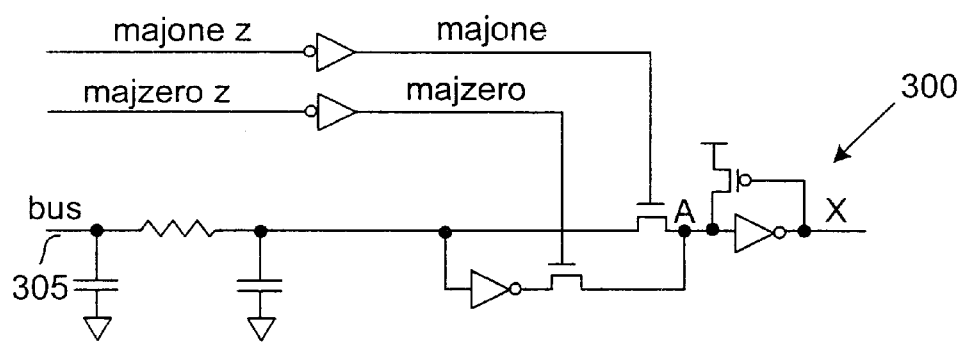
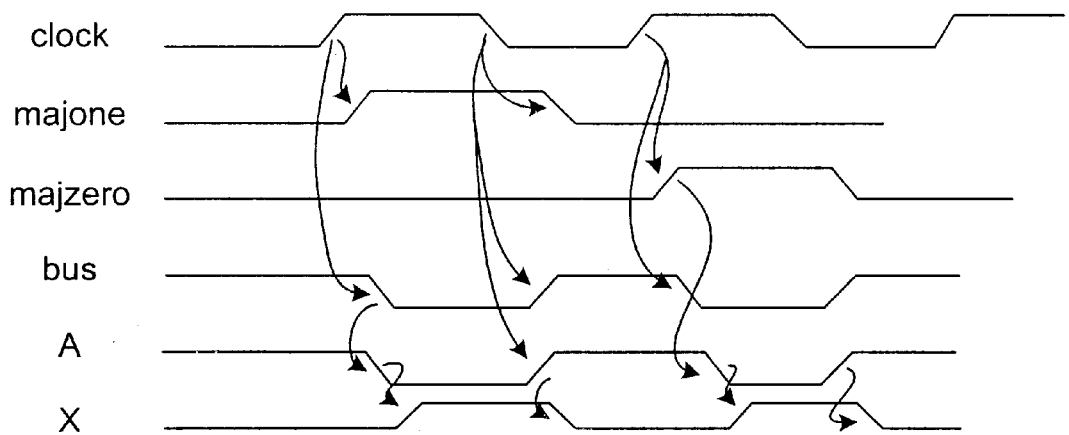
Fig. 3

Fig. 5  (a) Differential sense with domino output bus (b) Detail of one sense amplifier embodiment

METHOD AND APPARATUS FOR LOW POWER MEMORY

This is a continuation of application Ser. No. 09/587,495 filed on Jun. 2, 2000 now U.S. Pat. No. 6,608,779.

BACKGROUND

The present disclosure is related to memory circuitry and, more particularly, to implementing memories that use low amounts of power.

As is well-known, memory or memory circuits are used in a seemingly endless host of applications. Memory may be included in a laptop computer, in a desktop computer, or in a server, just to name a few examples. Memory may also be employed in a set top box, in a cell phone, and a host of other possible applications. Reducing the power consumption associated with the use of such memories in these applications or devices continues to be a desirable goal. For example, in a mobile laptop platform or in a cell phone, reducing the power consumption associated with the use of memory may lengthen the battery or power supply life for the cell phone or the mobile laptop platform. There are, of course, many other advantages to reducing the power consumption associated with the use of memory, and this is just one example. A need, therefore, exists for the continued development of techniques to accomplish this goal.

BRIEF DESCRIPTION OF DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 is a circuit diagram illustrating an embodiment of a technique for converting binary digital signals that may be produced by an embodiment of a low power memory in accordance with the present invention;

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 6:
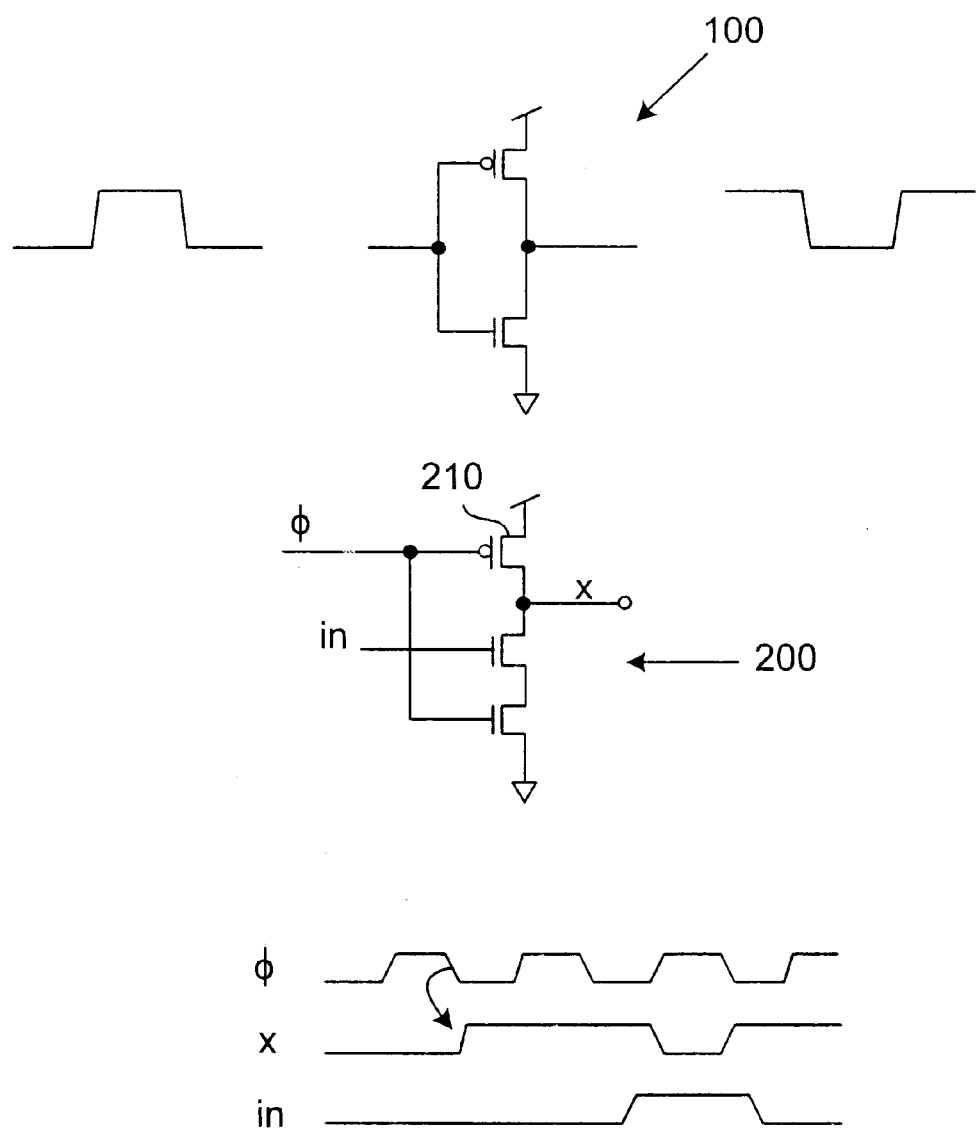
FIG. 6 is a circuit diagram illustrating the operation of dynamic and static logic circuitry.

As previously described, it is desirable in many situations to reduce the power consumption associated with the use of memory. Although the invention is not limited in scope in this respect, frequently, memory or memory circuits are implemented using dynamic logic, as opposed to static logic. This is illustrated in more detail in FIG. 6. The circuit at the top of FIG. 6 illustrates an inverter implemented using static logic, whereas the lower half of the figure illustrates an inverter implemented using dynamic logic. Although depending upon the particular situation and application, there may be a host of reasons for preferring one over the other, a reason that dynamic logic, also referred to as domino circuitry, is sometimes preferred is because it may typically result in an improvement in speed of execution and, furthermore, higher fan-in may be supported via "wire-ring," as is known to those of ordinary skilled in the art. One potential disadvantage, however, of dynamic logic is that, again, depending upon the particular situation, it may result in consumption of more power than a static logic implementation of the particular circuit.

A reason dynamic logic may result in this increased amount of power consumption is illustrated by the timing diagram of FIG. 6 in which a clock signal is applied to the gate of transistor 210. As illustrated by the timing diagram, the output signal x of inverter 200 toggles or switches states, which will typically result in the consumption of a greater amount of power. The power consumption of the clock is additive as well.

A way to view the operation of a dynamic logic circuit, such as 200 illustrated in FIG. 6, is that the output signal x charges to a particular state, typically known as the precharge state, and then, depending upon the input signal "IN," output signal x may either maintain that state, which does not result in a significant amount of power consumption, or alternatively, x may change state, which typically does result in power consumption because discharge of the previously charged state then takes place. Likewise, static circuit 100 does not toggle between charging and discharging if the applied input signal or state does not change. Since for a random input stream a domino circuit will change state twice (once to discharge and once to precharge) for each input change, while a static circuit changes once, the domino circuit typically has greater power consumption.

Figure 1:
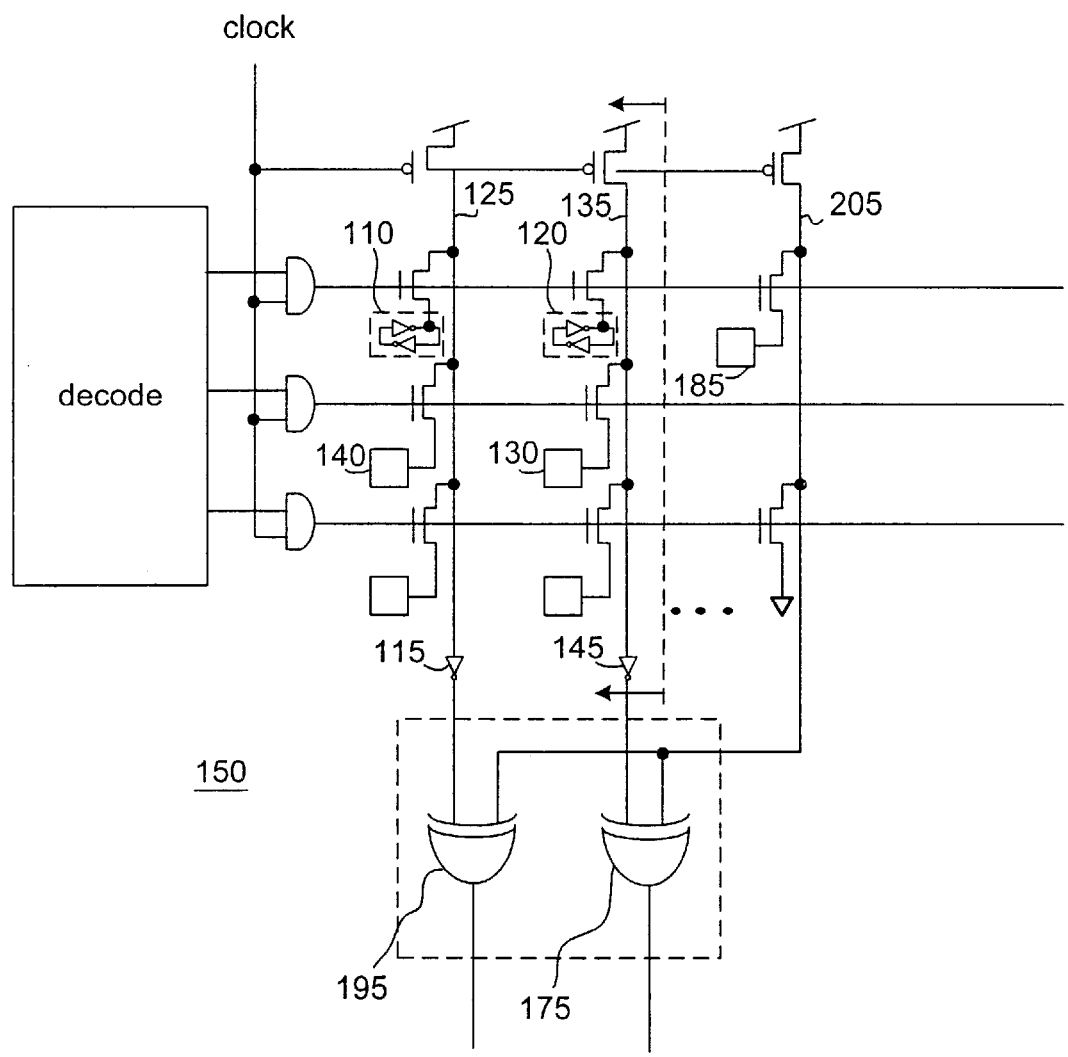
FIG. 1 is a circuit diagram illustrating a portion of an embodiment of a low power memory in accordance with the present invention.

As previously described, one advantage of applying dynamic circuitry is its improved speed of execution and fan-in over static logic. Therefore, it is relatively typical or common to employ dynamic circuitry in a memory. One example of such a memory, referred to in this context as a register file, is illustrated in FIG. 1 to the left of the dashed vertical line. It will, of course, be understood that the invention is not restricted in scope to being employed with memories implemented using only dynamic circuits or memories that comprise only register files. As will be explained in more detail later, embodiments in accordance with the present invention may be employed with other types of memories, other than register files, such as memories that employ double-sided signaling as opposed to single-ended signaling. In a circuit employing the former, for example, an output port may include two signaling lines, one of which is pulled low to indicate a one or zero cell state. This may be desirable in some situations to allow the use of differential amplifiers for sensing, which, typically are more sensitive than single ended circuits, and, therefore, have the ability to read a bitline with a more limited voltage swing (and, therefore, also employ less power). In contrast, single ended sensing may rely on an inverter or other static circuit to sense the full logic level swing, typically near Vdd/2, to determine whether the bitline was discharged or remained in the precharge state.

The cells of register file 150, such as 110, 120, 130, 140, and so forth, are referred to as register file cells in this context. As is well-known for such register file cells, the data read is "single-ended." More specifically, referring to cell 110 in FIG. 1, if, for example, bit line 125 is precharged high or as "logic 1" and cell 110 holds or stores a low or "logic 0," then reading data from cell 110 will not change the state of bit line 125 and sense amp 115 will output a "logic 0" for the content of cell 110. However, in contrast, for bit line 135, if cell 120 stores a 'logic 1," then reading the contents of cell 120 will pull bit line 135 from a high state to a low state so that sense amp 145 will output a logic high or "logic 1." Therefore, for this particular one-sided register file implementation, more power is consumed to read a logic 1 than a logic 0. Of course, the invention is not limited in scope in this respect. For example, an alternative approach may pre-discharge the bit line so that it takes more power to read a logic 0 than a logic 1.

However, for this particular embodiment, as previously demonstrated, more power will be consumed where "logic 1s" are read from memory than where "logic 0s" are read from memory. Therefore, for this particular embodiment, a way to reduce the consumption of power would be to store a grouping of bits, such as a 32-bit word, as one example, in inverted form if more than half of the bits or bit values are logic 1 rather than logic 0. Therefore, for this particular embodiment, a determination may be made if the data were to be stored in the register file as more "1s" than "0s." If it has more "0s," then it is stored as its logical self. However, if it has more "1s," then it is stored as the opposite of its logical self. For example, for a 32-bit word, if it had 17 or 18 "1s" and the rest "0s," then it is stored in an inverted form. As previously discussed, storing a grouping of bits or binary digital signal values this way will enable less bit line charging and discharging and reduce power consumption.

It is noted, however, that for an embodiment of a low power memory in accordance with the present invention, for example, embodiment 150 illustrated in FIG. 1, an extra bit is employed so that when data is read, it may be determined if it is stored in inverted form or in non-inverted form. This additional bit, for example, is stored in cell 185, as illustrated in FIG. 1. This additional bit may be employed to convert from inverted form to non-inverted form, as desired. For example, as illustrated, bit line 125 is coupled to an exclusive or (XOR) gate 195, whereas bit line 135 is coupled to XOR gate 175; however, bit line 205, which is the bit line providing the extra bit in this embodiment, couples to both XOR gates in this particular embodiment. This allows the data to be converted back when appropriate. As also illustrated in FIG. 1, the XOR gate may be used directly to sense and convert the voltage without the intervening inverter.

Figure 4:
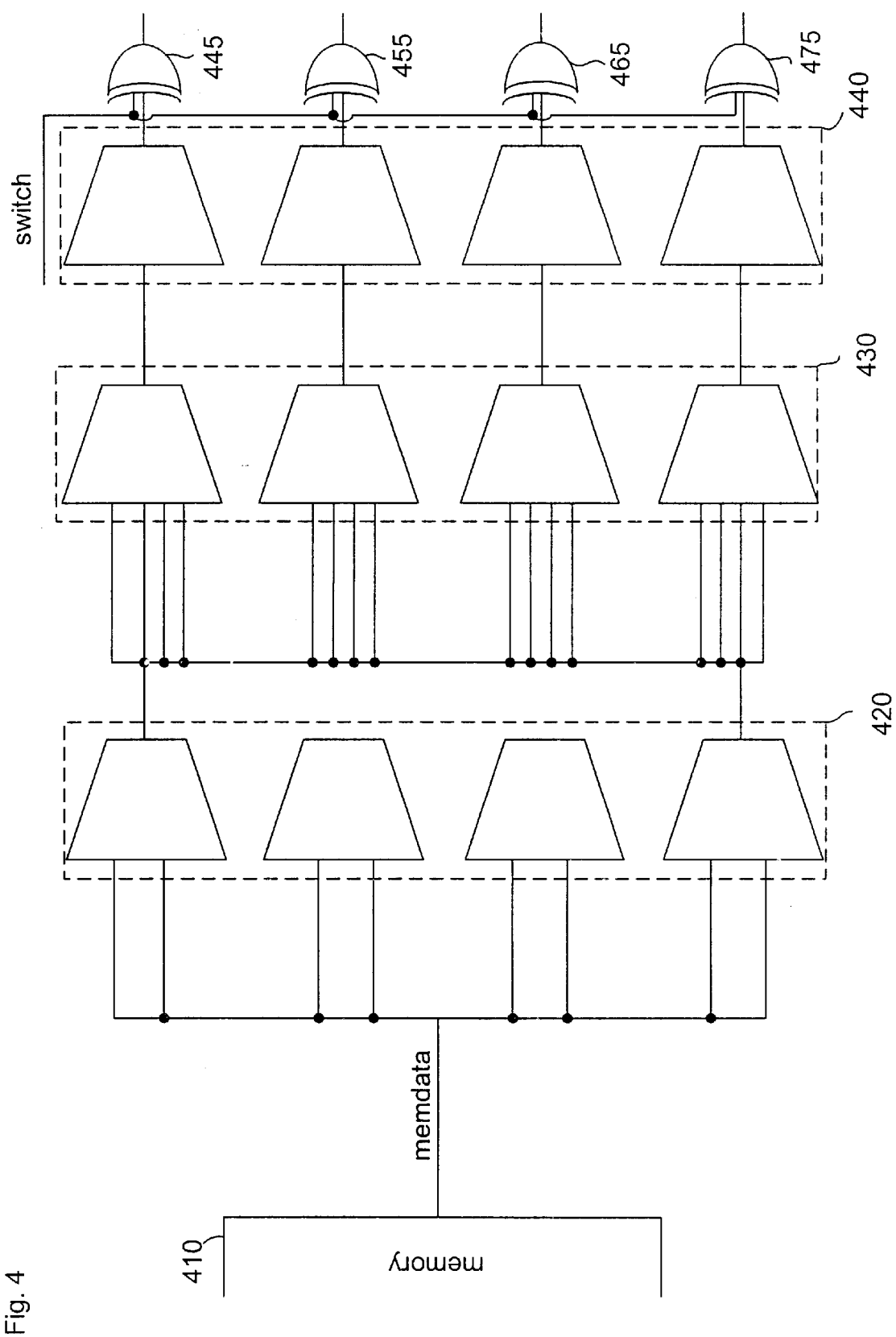
FIG. 4 is a schematic diagram illustrating an application of an embodiment of a low power memory in accordance with the present invention.

It is noted that a binary digital signal or bit being converted from inverted form to non-inverted form upon being read from memory, in such an embodiment, is within the scope of the present invention; nonetheless, the invention is not restricted in scope to this approach. For example, in an alternative embodiment, such as illustrated in FIG. 4, it may be desirable to maintain the binary digital signals or grouping of bits in a form that results in additional power consumption reduction as operations are performed on the binary digital signals. Such an approach is illustrated schematically in FIG. 4. For example, the binary digital signals are read from memory 410 in either inverted or non-inverted form, depending upon which form results in power savings, as previously described, and the binary digital signals are maintained in that form for processing, such as, in this embodiment, for example, by multiplexors 420, 430, and 440. Here, implementation of the multiplexors using domino or pre-charged circuitry is well-known to those skilled in the art to typically be faster than if implemented with static circuits. By keeping the data in "majority one" form, for this embodiment, the greater power dissipation of the faster domino circuits may be at least partially, and potentially mostly, mitigated, while speed is gained, as desired. Therefore, any one of a host of operations may be performed on the binary digital signals or bits in this form, such as, without limitation, for example, a rotation operation, a sign extend operation, or a byte select operation. For example, although these specific operations are not illustrated in FIG. 4 in detail, such operations are typically implemented through multiplexing of the type illustrated. By maintaining the binary digital signals in this form, power savings will result throughout the data path because, as previously described in conjunction with a memory employing dynamic logic, where dynamic logic is employed in the data path, the amount of discharging that occurs for a bit line is reduced, resulting in power savings. Once, however, it is desired to output the binary digital signals or bits, the bits may be converted to proper form using the extra bit previously described. This is illustrated in FIG. 4 by XOR gates 445, 455, 465, and 475. Of course, if the binary digital signals move through the data path in a non-inverted form because that results in power savings, the binary digital signal will be produced or output in non-inverted form by these XOR gates. Additionally, receiving circuitry frequently employs both polarities of the data, eg, in adders or comparison circuitry. In this case, even the small amount of overhead of the XOR gates may potentially be reduced to a multiplexor.

It will, of course, be appreciated that circuits previously described are merely intended to demonstrate particular embodiments in accordance with the invention. Many other circuit approaches may be employed that are included within the scope of the invention. For example, but without intending any limitation, instead of employing a XOR gate to perform the desired conversion, as previously described, an alternative approach that may be employed is illustrated in FIG. 3 by embodiment 300. This approach, for example, might be employed where two-sided signaling is used on the majority signal. However, again, other approaches for signaling may be employed. As illustrated in FIG. 300, a signal or bit is provided indicating whether the word or grouping being transported across bus 305 is comprised mostly of bits that have a "logic 0" value, in which case it is provided in non-inverted form or, alternatively, is comprised mostly of bits that have a "logic 1" value, in which case it is provided in inverted form and is, therefore, converted to non-inverted form by the embodiment illustrated in FIG. 3. Again, this conversion back from "power saving encoding" may be applied at the end of the dynamic portion of the path, or where it is most convenient from a circuit timing perspective, rather than immediately after being read from memory.

Figure 2:
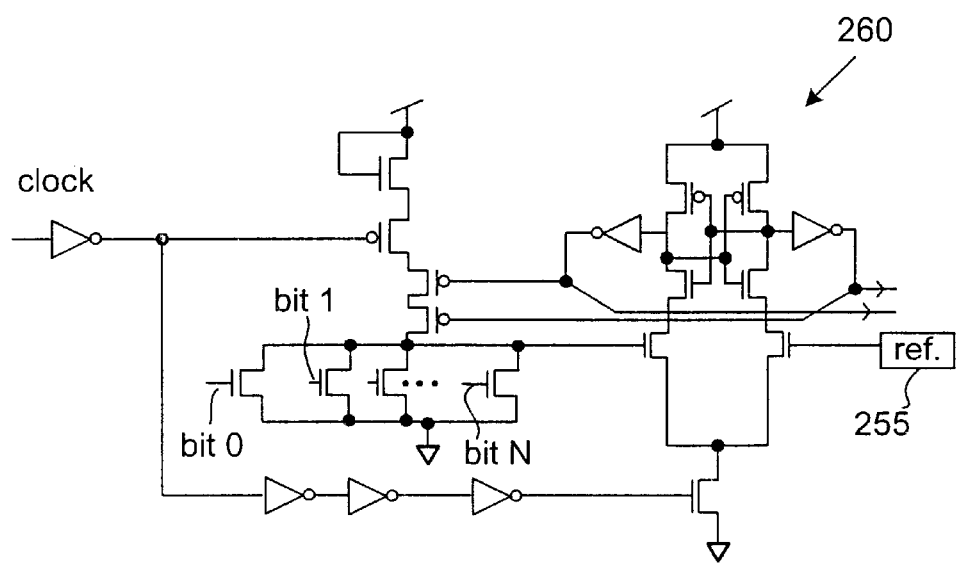
FIG. 2 is a circuit diagram illustrating another embodiment portion that may be employed in conjunction with the embodiment portion of a low power memory illustrated in FIG. 1.

Another aspect of this particular embodiment of the invention is illustrated in FIG. 2. FIG. 2 illustrates a circuit to determine whether the word or grouping of bits to be read into memory comprises more of "logic 1s" or "logical 1" bits, or more of "logic 0s" or "logical 0" bits. Of course, again, other approaches to making this determination may be implemented using different circuitry, and the invention is not limited in scope to this particular circuit embodiment. In this particular embodiment, is a device coupled to compare to be applied voltage levels. One of the to be applied voltage levels comprises a voltage reference signal. The other of the to be applied voltage levels comprises a voltage signal to be formed by a plurality of transistors coupled in parallel. In this embodiment, as illustrated, respective transistors of the plurality having voltages to be applied to their respective transistor control ports corresponding to the logical state of a bit. Here, the logical state of the bit corresponding to that particular transistor corresponds to the voltage is to be applied. As illustrated in FIG. 2, the device to compare the voltage levels in this embodiment comprises a sense amp or voltage comparator 260 that receives two input signals, although, of course, the invention is not limited in scope in this respect. One of the input signals is provided by a voltage reference 255. This voltage reference provides the voltage signal that would be provided for a word or grouping of bits that is half "logical 1s" and half "logical 0s." For example, assuming, for this embodiment, a 32-bit word or grouping and assuming that a "logical 0" is about 0 volts and a "logical 1" is one about volt, then reference 255 would provide about a half a volt signal to sense amp 260. Likewise, the other input signal applied to sense amp 260 is provided by the individual bits of the particular binary digital signals or grouping of bits being coupled in parallel, as illustrated in FIG. 2. Coupling the bits in parallel results in a voltage being applied to the input port of the sense amp 260 obtained by summing the voltages of each bit and dividing by the number of bits. Therefore, effectively an average voltage level will be applied. Thus, if more than half the bits are "logical 1," then in this particular example, where a "logical 1" is about 1 volt and a "logical 0" is about 0 volts, a voltage signal greater than one half volt will be applied. In contrast, if more than half of the bits are "logical 0," then a voltage signal of less than a half a volt will be applied. In the case where the count of "logic 1" or "logical 1" bits equals that of "logic or logical 0" bits, no power is saved and the choice may be made arbitrarily. This implies that, for some embodiments at least, the precision of the comparator may be limited since if the circuit provides incorrect results for counts of logic 1s and logic 0s that are very near each other, little extra power is wasted. Essentially, relatively speaking, greater benefit is derived from data that includes more logic 1s or logic 0s.

Figure 5:
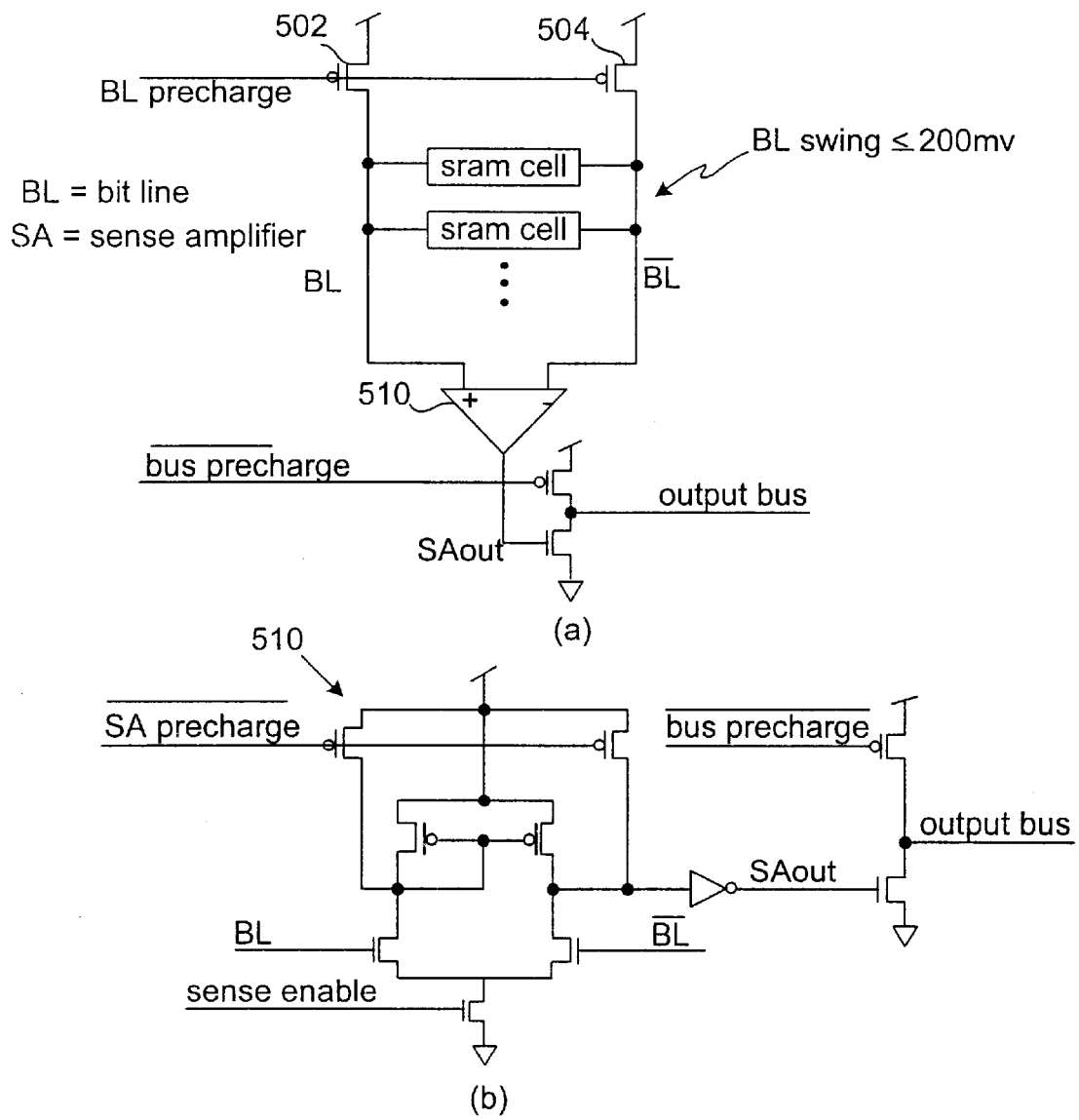
FIG. 5 is a circuit diagram illustrating an embodiment of a sense amplifier that may be employed in an embodiment of a low power memory in accordance with the present invention.

Although the previously described embodiment illustrated a case involving single-ended signaling, the scope of the invention also includes a low power memory embodiment employing double-sided signaling. Such an approach or technique is illustrated by the embodiment of a sense amp shown in FIG. 5. As shown in FIG. 5, a double-sided signal that is to be read into memory is provided to sense amp 510. In particular, a "0" or "1" is applied to transistors 502 and 504. Typically, the sense amp will switch states depending upon which is applied to the respective gates of these transistors and the previous state of the sense amp. However, use of the differential sense amp allows the state of the memory cell to be determined with a relatively small voltage swing (and, hence, the use of little power). However, the sense amp switches states due to the feedback aspect of the sense amp arising from the coupling of transistors, as shown in FIG. 5. This particular aspect of the operation of a sense amplifier is well-known. However, in this circumstance or situation, power consumption may be reduced by employing an embodiment in accordance with the present invention. In particular, in this example, sense amp 510 and the precharged output bus is typically charged to a preferred state. Therefore, maintaining the sense amp in that preferred state consumes less power since discharge of the large capacitance output bus may be not occur as frequently.

The previously described approach, therefore, employing a sense amplifier for each bit, as one example, may result in power savings by inverting the bits when more than half of the bits in the grouping have a logical value which is not the preferred state of the sense amps employed. Implementing such an approach may employ the previously described embodiments, although the invention is not limited in scope in this respect. For example, a circuit, such as the circuit embodiment shown in FIG. 2, may be employed to determine whether the grouping of bits has a majority of "logical 1" or "logical 0" values. Likewise, an extra bit may be employed, as previously described, and, likewise, this form may be employed both by the memory and along the data path, as previously described for a single-ended signaling approach.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A circuit comprising:
   a device coupled to compare to be applied voltage levels, wherein one of the to be applied voltage levels comprises a voltage reference signal; and
   wherein the other of the to be applied voltage levels comprises a voltage signal to be formed by a plurality of transistors coupled in parallel, respective transistors of the plurality having voltages to be applied to their respective transistor control ports corresponding to the logical state of a bit corresponding to that particular transistor to which the voltage is to be applied.

2. The circuit of claim 1, wherein the device coupled to compare the to be applied voltage levels comprises a sense amplifier.

3. The circuit of claim 1, wherein the transistors comprise metal-oxide semiconductor (MOS) transistors and the transistor control ports comprise gates.

4. The circuit of claim 3, wherein the gates of the transistors are coupled to receive binary digital signals to be read into memory.

* * * * *